(12) United States Patent
Carlisle et al.

(10) Patent No.: US 7,556,982 B2
(45) Date of Patent: Jul. 7, 2009

(54) METHOD TO GROW PURE NANOCRYSTALLINE DIAMOND FILMS AT LOW TEMPERATURES AND HIGH DEPOSITION RATES

(75) Inventors: John A. Carlisle, Plainfield, IL (US); Dieter M. Gruen, Downers Grove, IL (US); Orlando Auciello, Bolingbrook, IL (US); Xingcheng Xiao, Woodridge, IL (US)

(73) Assignee: UChicago Argonne, LLC, Chicago, IL (US)

( * ) Notice: Subject to any disclaimer, the term of this patent is extended or adjusted under 35 U.S.C. 154(b) by 723 days.

(21) Appl. No.: 10/892,736

(22) Filed: Jul. 15, 2004

(65) Prior Publication Data

US 2005/0031785 A1 Feb. 10, 2005

Related U.S. Application Data

(60) Provisional application No. 60/493,152, filed on Aug. 7, 2003.

(51) Int. Cl.
*H01L 21/00* (2006.01)
(52) U.S. Cl. ..................................... 438/105
(58) Field of Classification Search ............... 438/299, 438/105; 427/249.8, 586; 175/374; 257/325; 428/408; 148/513; 423/446; 117/104
See application file for complete search history.

(56) References Cited

U.S. PATENT DOCUMENTS

| | | | | |
|---|---|---|---|---|
| 5,149,381 A | * | 9/1992 | Grewe et al. | 148/513 |
| 5,698,328 A | * | 12/1997 | Bunshah et al. | 428/408 |
| 5,772,760 A | * | 6/1998 | Gruen et al. | 117/104 |
| 5,954,147 A | * | 9/1999 | Overstreet et al. | 175/374 |
| 5,989,511 A | * | 11/1999 | Gruen et al. | 423/446 |
| 6,586,797 B2 | * | 7/2003 | Forbes et al. | 257/325 |
| 6,667,215 B2 | * | 12/2003 | Theiss et al. | 438/299 |
| 6,746,893 B1 | * | 6/2004 | Forbes et al. | 438/105 |
| 2003/0152700 A1 | * | 8/2003 | Asmussen et al. | 427/249.8 |
| 2005/0042161 A1 | | 2/2005 | Carlisle et al. | |
| 2007/0020403 A1 | * | 1/2007 | Yoshitake et al. | 427/586 |

* cited by examiner

*Primary Examiner*—Davienne Monbleau
*Assistant Examiner*—Monica D Harrison
(74) *Attorney, Agent, or Firm*—Olson & Cepuritis, Ltd.

(57) ABSTRACT

A method of depositing nanocrystalline diamond film on a substrate at a rate of not less than about 0.2 microns/hour at a substrate temperature less than about 500° C. The method includes seeding the substrate surface with nanocrystalline diamond powder to an areal density of not less than about $10^{10}$ sites/cm$^2$, and contacting the seeded substrate surface with a gas of about 99% by volume of an inert gas other than helium and about 1% by volume of methane or hydrogen and one or more of acetylene, fullerene and anthracene in the presence of a microwave induced plasma while maintaining the substrate temperature less than about 500° C. to deposit nanocrystalline diamond on the seeded substrate surface at a rate not less than about 0.2 microns/hour. Coatings of nanocrystalline diamond with average particle diameters of less than about 20 nanometers can be deposited with thermal budgets of 500° C.-4 hours or less onto a variety of substrates such as MEMS devices.

16 Claims, 10 Drawing Sheets

Growth of thick, continous films at low temperature

- Initial nucleation density critical
  - ~10¹⁰/cm²
- Nanodiamond powder
- All grown at 500°C for 4 hr Seeding time:5min   Seeding time:10min
Seeding time:15min   Seeding time:25min

Growth of thick, continuous films at low temperature

Seeding time:5min

Seeding time:10min

Seeding time:15min

Seeding time:25min

- Initial nucleation density critical
  - ~$10^{10}$/cm$^2$
- Nanodiamond powder
- All grown at 500°C for 4 hr

Visible Raman Data

- Wavelength $\lambda = 633$ nm
- Very sensitive to $sp^2$ bonding in carbon films
- Very widely used
- Very controversal!
- Spectral weigh from grain boundary atoms only?
  - UV Raman has no/small 1332 peak
- Break at ~650°C?
  - Hydrogen desorption Temperature

NEXAFS from diamond and graphite

- Near-edge x-ray absorption fine structure
  - Advanced Light Source or Synchrotron Radiation Center
  - Density of unoccupied states
- Local probe
- Linear probe
  - Unlike XRD, Raman
- Lots of contrast between $sp^2$ and $sp^3$ bonded carbon
- $\sigma^*$ exciton very sensitive to short range order
- $2^{nd}$ bandgap in diamond at 302 eV

NEXAFS data as function of temperature

- "Normal" UNCD:
  - Grown at 800°C
  - Very little $\pi^*$
  - Well-defined $\sigma^*$ exciton
  - 2nd band gap at 303 eV

- As temperature decreases
  - Lineshape doesn't change much!
  - $\pi^*$ decreases?
  - $\sigma^*$ exciton persists
  - 2nd bandgap shallows

- 250°C film still has lots of sp3-bonded carbon!

Low-temp UNCD growth onto CMOS chip

- UNCD was grown at ~400C onto CMOS circuity
  - CMOS thermal budget: ~2hrs at 400C
- Transistors tested after 6 hrs deposition time
- They still work!!
- UNCD MEMS on CMOS a real possibility!

Good conformal deposition of
UNCD on microcircuit features

METHOD TO GROW PURE NANOCRYSTALLINE DIAMOND FILMS AT LOW TEMPERATURES AND HIGH DEPOSITION RATES

RELATED APPLICATIONS

This application, pursuant to 37 C.F.R. 1.78(c), claims priority based on provisional application Ser. No. 60/493,152 filed on Aug. 7, 2003.

The United States Government has rights in this invention pursuant to Contract No. W-31-109-ENG-38 between the U.S. Department of Energy (DOE) and The University of Chicago representing Argonne National Laboratory.

SUMMARY OF THE INVENTION

This invention relates to an improved method for preparing nanocrystalline diamond films. More specifically this invention relates to an improved method for preparing phase-pure nanocrystalline diamond films at low temperatures and with high deposition rates. Ultrananocrystalline diamond (UNCD) films grown at high temperatures (700-900° C.) have grain sizes between about 3 and about 5 nanometers and preferably are fully dense and continuous throughout. A method of preparing UNCD films is disclosed in U.S. patent application Ser. No. 10/845,867 filed May 13, 2004, the disclosure of which is incorporated herein by reference. Major techniques for depositing diamond-like films onto substrates involve using hydrogen-rich plasma chemistries via plasma enhanced chemical vapor deposition (PECVD) using either RF or microwave frequencies, and hot-filament reactors. The drawback to these techniques is that the deposition takes place at temperatures typically between 700° C. and 900° C. There are applications for diamond films in microelectromechanical systems (MEMS) and field emission, where the different materials in use require that the films be deposited at much lower temperatures, thus ruling out the use of materials that must be deposited at high temperatures. For example, many MEMS devices are fabricated on top of or co-planer with CMOS integrated circuit (IC) electronics. The "thermal budget" requirement for most IC chips, that is, the maximum duration at which the chip can be subjected to a given temperature, places not only a temperature constraint but also a time constraint on the deposition of the diamond film. For most CMOS chips this thermal budget is on the order of one hour (or less) for temperatures of about 350-450° C. Diamond-like carbon (DLC) films can be deposited at or near room temperature, but these films are intrinsically inferior to UNCD film.

The invention is an improved method of preparing nanocrystalline diamond films having average grain size about 20 nm or less, deposited at low temperatures of less than about 5000 C with deposition rates high enough so that enough film can be deposited to be useful, particularly as an antistiction coating (stiction refers to a combination of static friction and adhesion forces) in MEMS devices, at deposition rates of about ¼ to about ½ micron/hr. It is important that the films also be continuous, pinhole free and fully dense, for applications as electrochemical electrodes or hermetic coatings, for bio-MEMS devices for example. The improved method includes the following: 1) the use of nanocrystalline diamond powder, preferably of average grain size less than about 30 nm, to seed the substrate surface prior to growth to reduce deposition time. 2) Fine control of plasma power and pressure during the growth process to control and minimize plasma heating of the substrate. 3) Use of a water-cooled sample holder which incorporates both active heating and cooling to control the temperature of the substrate in the range of 200-500° C. 4) Continuous rotation of the sample to enhance uniformity of the temperature of the sample during growth, which leads to films being deposited over large areas with uniform thickness. Low temperature deposited UNCD films of the present invention have average grain sizes up to about 20 nm with most preferred average grain sizes about 10 nm or less. These are slightly larger than UNCD (3-5 nm) grown at high temperature.

The invention consists of certain novel features and a combination of parts hereinafter described, illustrated in the accompanying drawings.

DESCRIPTION OF THE PREFERRED EMBODIMENT

1. A silicon wafer 100 mm in diameter was cleaned and seeded by immersing the wafer in an ultrasonic bath containing a mixture of nanometer sized diamond powder and an organic solvent (acetone, methanol, etc.). After the ultrasound, the wafer was removed from the bath and rinsed using a combination of organic solvent and distilled wafer. The seeding process was optimized to give the maximum initial areal nucleation density possible, about $10^{10}$ sites/cm$^2$ (FIG. 1); however, nucleation areal densities in the range of from about $10^{10}$ to $10^{12}$ are satisfactory.

Figure 2:
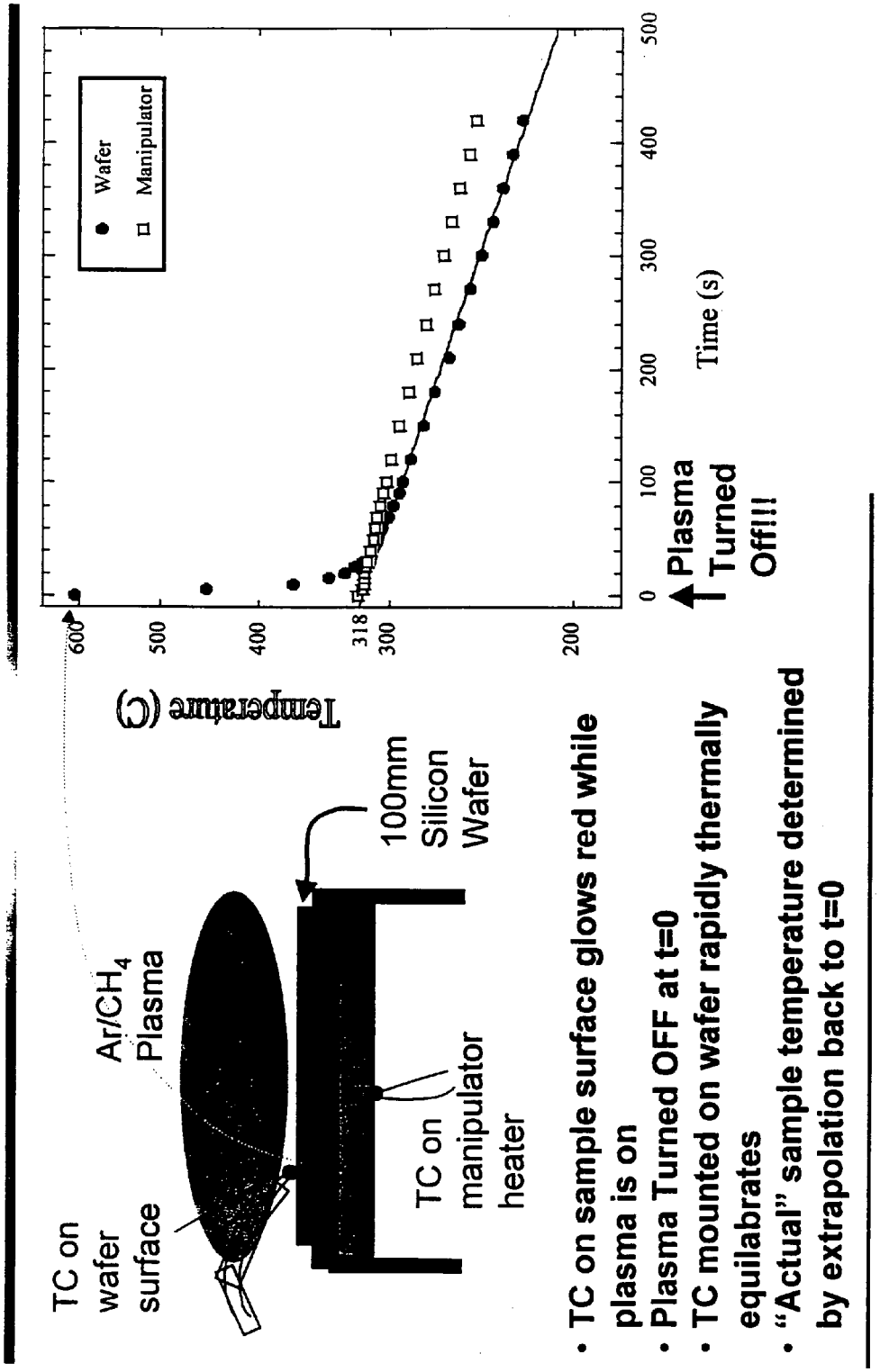
FIG. 2 illustrates the temperature calibration that was performed as a function of temperatures and time to determine the temperature of the substrate during deposition.

2. Prior to UNCD deposition, the temperature of the substrate wafer during growth was calibrated through the use of a thermocouple mounted to the surface of a test wafer which was loaded into the microwave plasma chemical vapor deposition system and exposed to the same set of process conditions as would be used to grow a film at low temperatures (FIG. 2). It is not necessary to perform this step every time a low-temperature deposition is to be performed. With the substrate heater turned OFF, it was estimated that the temperature was about 318° C.+/−50° C. By turning the heater ON and supplying differing amount of heating current to the heater, the temperature at the wafer surface was continuously adjusted from about 320° C. to 850° C.

3. The seeded silicon wafer was loaded into the plasma system, and the chamber was pumped down using vacuum pumps to a pressure of about 10-4 Torr for a period of about 30 minutes, to remove as much nitrogen gas from the deposition system prior to deposition of UNCD.

4. A mixture of argon, methane, and hydrogen gases were flowed into the chamber, a plasma was struck, and the flows adjusted until the steady-state conditions were achieved. These conditions were: Ar flow: 49.5 sccm, $CH_4$ flow: 0.5 sccm, Pressure: 200 mbarr, microwave power: 800 W. As is understood $CH_4$ disassociates producing hydrogen.

5. The position of the wafer relative to the plasma was adjusted vertically so that the wafer surface just contacted the bottom of the plasma. If the wafer position was too high, then the heating of the wafer surface by the plasma was too great, leading to both higher temperatures and non-uniform temperatures across the wafer surface. If the wafer position is too low, then no growth of UNCD will occur. Adjustment to obtain the desired substrate (wafer) temperature is within the skill of the art.

6. The growth time for the inventive films was four hours. In practice, this time would be adjusted based on the intended application. After four hours had elapsed, the microwave power was turned off, the gas flows stopped, and then Ar gas was flowed at a high rate (400 sccm) to cool the sample rapidly. After about 30 minutes, the wafer was then removed and subjected to characterization using Raman Spectroscopy, scanning electron microscopy (SEM), high-resolution transmission electron microscopy (TEM), and near-edge x-ray absorption fine structure (NEXFAS).

Figure 3:
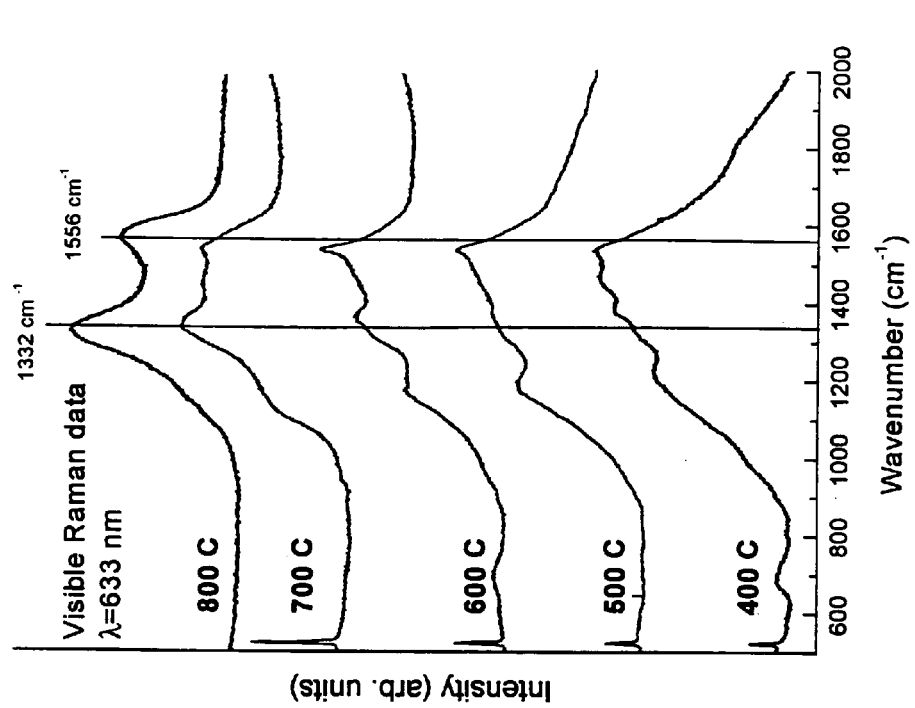
FIG. 3 illustrates the visible Raman data of films deposited at substrate temperatures of 400° C. to 800° C.

7. FIG. 3 shows a series of Raman spectra obtained from films grown at different temperatures. Interpretation of these spectra is that the spectrum effectively represents the $sp^2$-bonding structures within the grain boundaries only and not the grains themselves. The change in line shape between 600° C. and 700° C. indicates the role of hydrogen in the growth.

Figure 4:
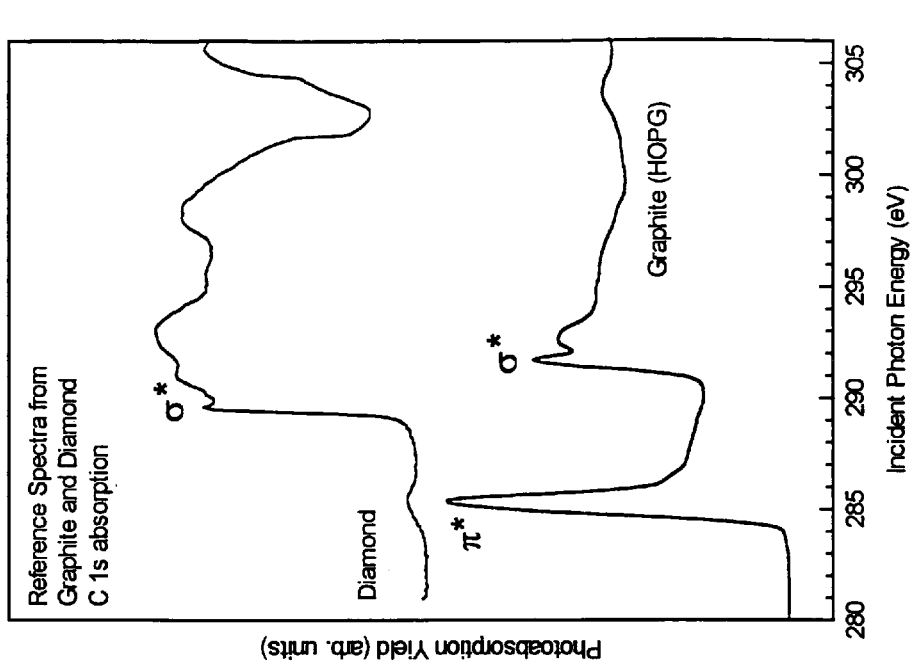
FIG. 4 illustrates the NEXAFS data from diamond and graphite reference films.
Figure 5:
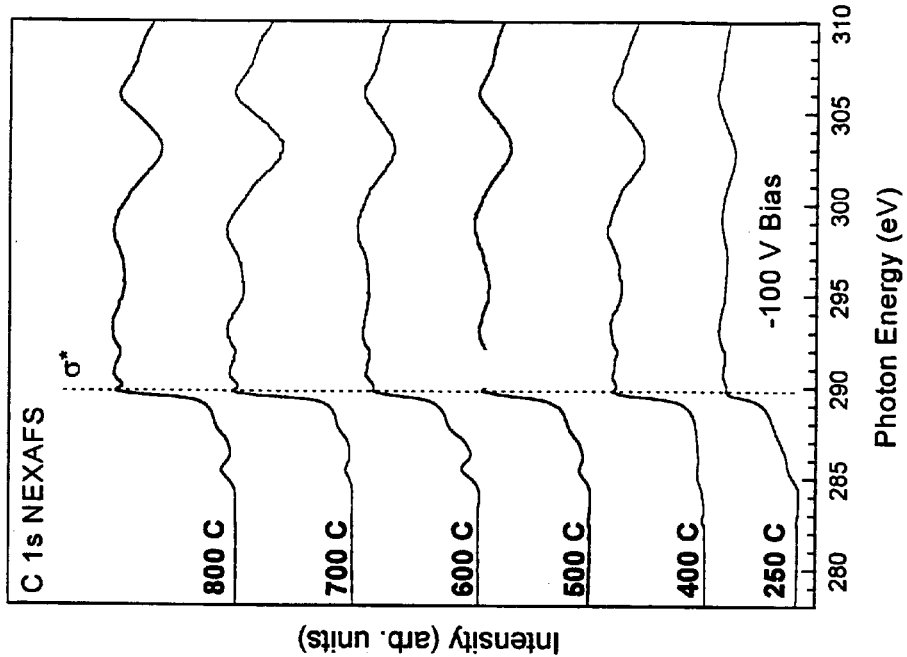
FIG. 5 illustrates the NEXAFS data as a function of temperature.

8. FIGS. 4-5 show the near-edge x-ray absorption spectroscopy data (NEXAFS) obtained from diamond and graphite reference samples and a series of films grown at low temperatures. These data clearly show that all of the films contain a substantial amount (greater than 90%) $sp^3$ (diamond) bonding.

Figure 6:
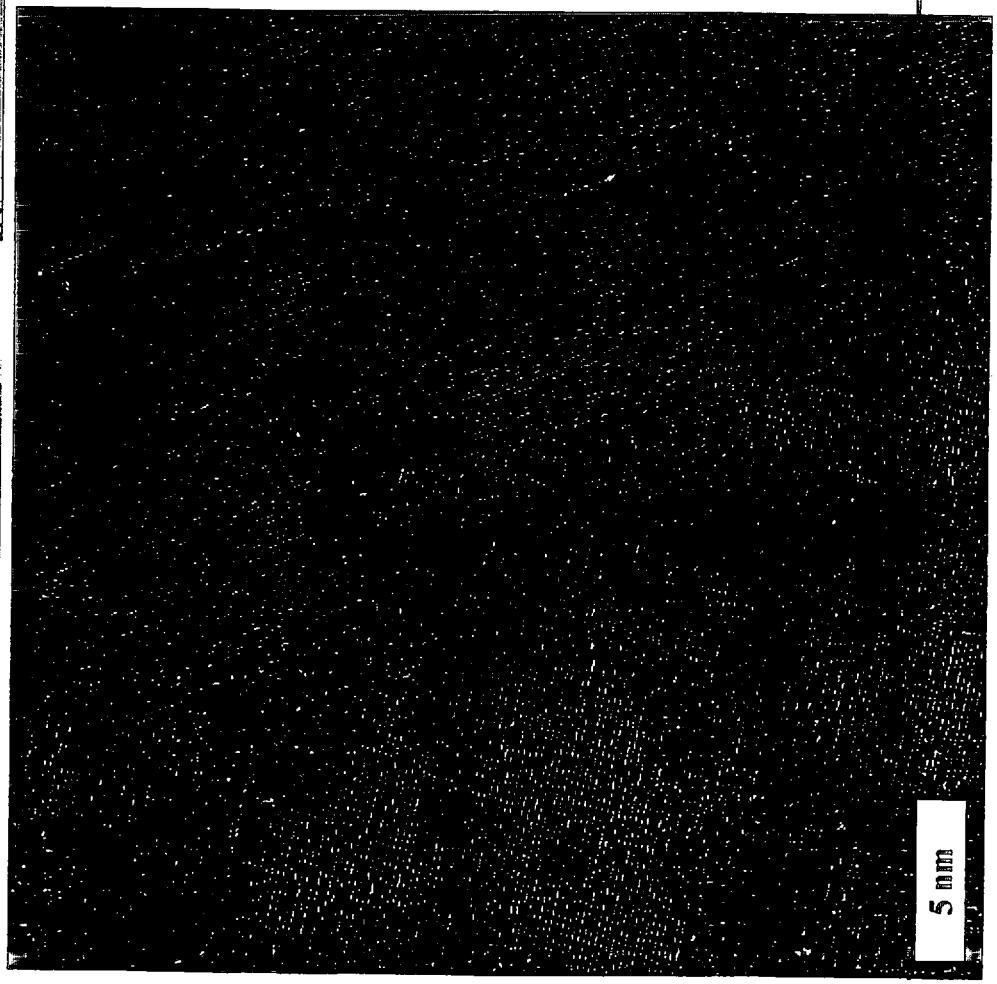
FIG. 6 illustrates the high resolution TEM taken from a UNCD film grown at low temperature.
Figure 7:
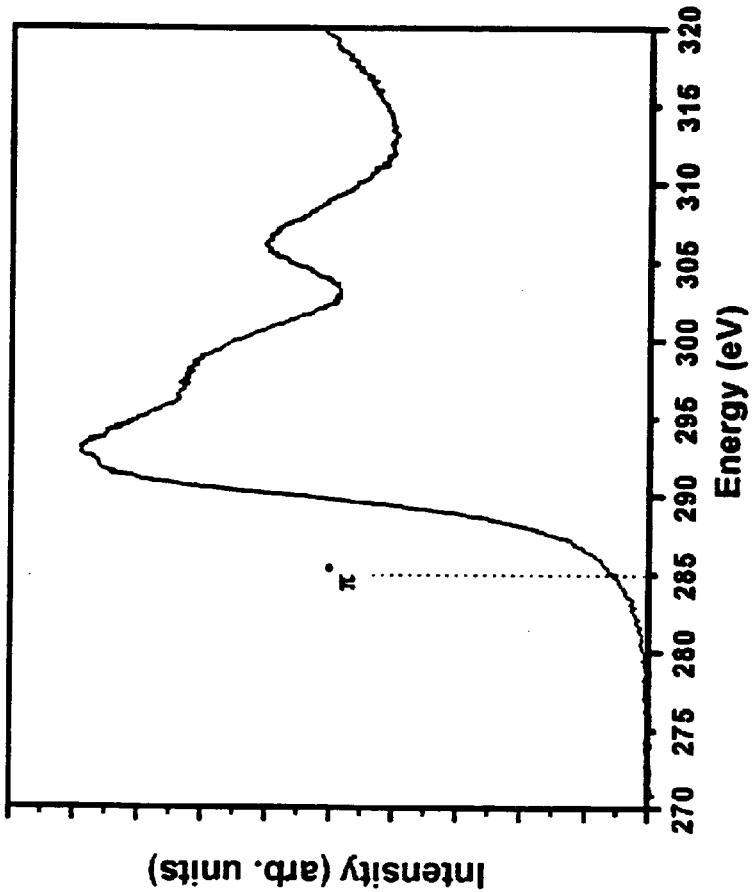
FIG. 7 illustrates Electron Energy Loss Spectra of Low Temp UNCD.
Figure 8:
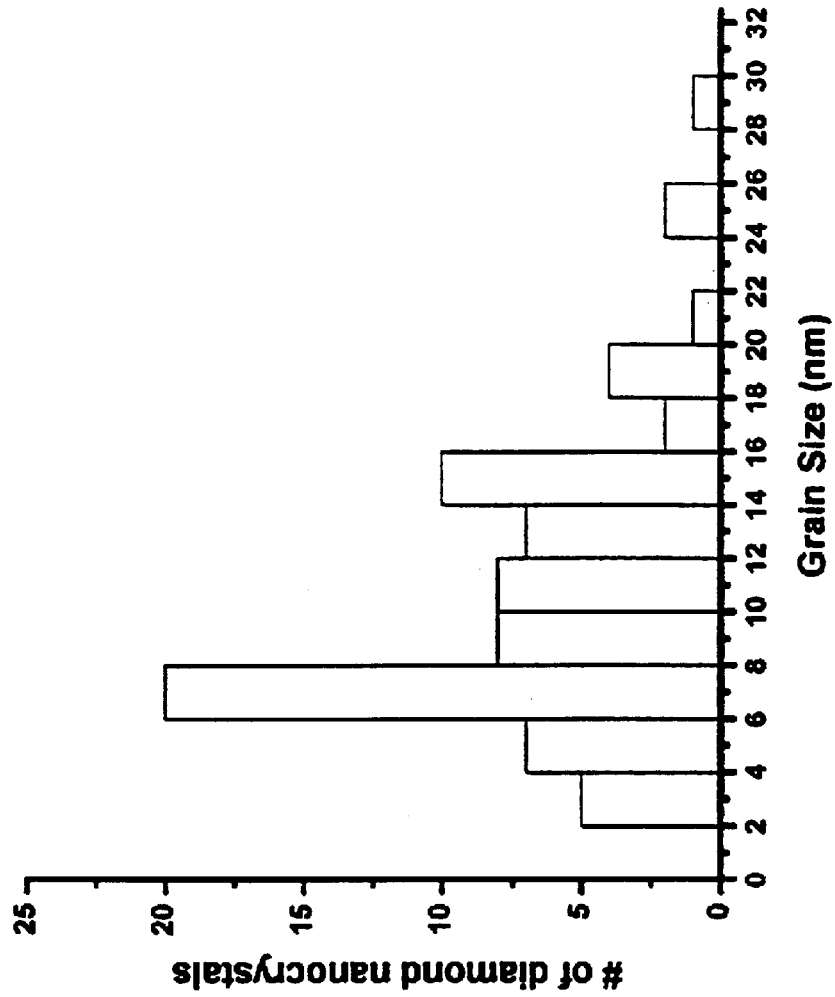
FIG. 8 illustrates the grain size distribution in a 400° C. grown UNCD film.
Figure 9:
FIG. 9 illustrates the SEM of UNCD films grown at 400° C. and 800° C. and a SEM cross-section of the 400° C. film.
Figure 9:
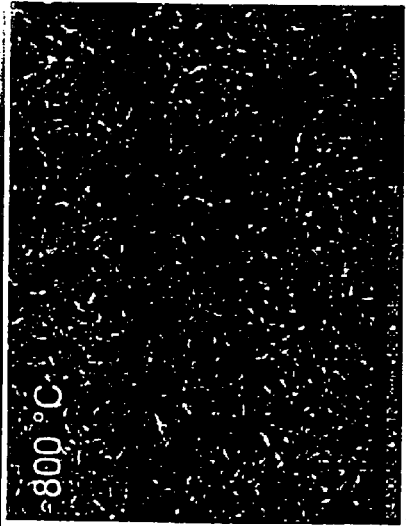
Figure 9:
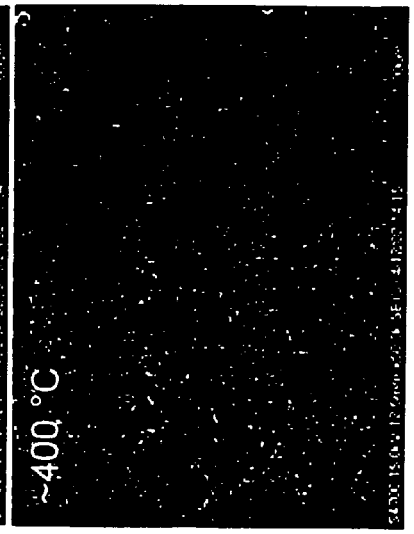

9. FIGS. 6-8 show high-resolution transmission electron microscopy data (TEM) obtained from a low-temperature film grown at about 400° C. These data clearly indicate that the low-temperature films consist of grains 3-20 nm in size (average about 10 nm) and abrupt grain boundaries; a very similar nanoscale structure compared to UNCD films (3-5 nm) grown at 800° C.

Figure 10:
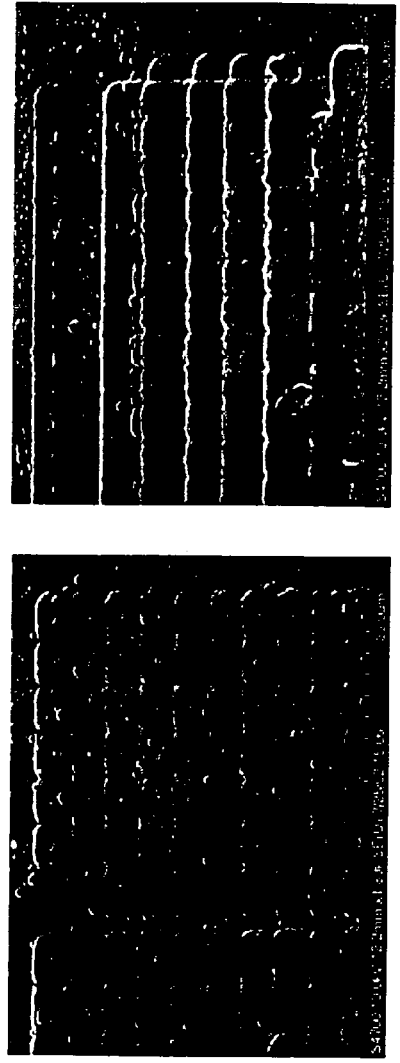
FIG. 10 illustrates low-temperature UNCD growth onto a CMOS chip.

10. FIG. 10 shows that we successfully grew on a silicon wafer containing microelectronic CMOS (complementary metal-oxide-semiconductor) circuits with a low-temperature UNCD film. The circuitry was tested extensively following the deposition and all the transistors were still functional and survived the deposition. The thermal budget was about 425° C. for 4 hours.

The overarching goal of diamond thin film research is to develop techniques and practices that allow the deposition of films on a variety of substrates that retain most if not all of the outstanding properties of natural diamond (hardness, electron mobility, thermal conductivity, etc.). This work has been going on for many years and has resulted in a number of thin film deposition technologies for growing diamond (>95% $sp^3$ bonded carbon) films, including the patented ultrananocrystalline diamond (UNCD) technology invented by Gruen and co-workers at Argonne National Laboratory. The two major techniques are plasma enhanced chemical vapor deposition (PECVD, using either RF or microwave frequencies) and hot-filament reactors. A drawback to many of these deposition technologies (which is not shared by UNCD, as explained below), is the requirement that the deposition take place at relativity high temperatures, typically between 700° C. and 900° C. There are many potential applications of diamond films, in microelectromechanical systems (MEMS) and field emission, for instance, where the demands of materials integration require that the films be deposited at much lower temperatures, and thus the use of these films in many of these applications is ruled out on this basis. In particular, for MEMS, many devices are fabricated on top of or co-planar with CMOS IC electronics. The "thermal budget" requirement for most IC chips, which is the maximum duration that the chip can be subjected to a given temperature, places both a temperature and time constraint on the deposition process. For most CMOS chips this thermal budget is on the order of one hour (or less) for temperatures of about 350-450° C.

A crucial aspect of the current invention is the realization that, with a few additional processing steps and the application of voltages to the sample during growth, the fundamental deposition chemistry involved in the UNCD technology developed at ANL will allow nanocrystalline diamond films to be deposited at low temperatures with deposition rates high enough so that enough film can be deposited to be useful, particularly as an anti-stiction coating in current and future MEMS devices. It is important that the films also be continuous, pinhole free, and fully dense, for applications such as electrochemical electrodes or hermetic coatings.

The UNCD technology involves the generation of $C_2$-dimer molecules, which are believed to be the fundamental growth species for the synthesis of UNCD thin films. $C_2$ dimers are generated in noble-gas discharges, in which a small amount of carbon source gas is added. Currently the typical plasma chemistries use a gas mixture of 99% Ar with 1% $CH_4$. $C_2$ dimers will naturally insert into the diamond lattice with remarkably low activation energies of 5.9 kcal/mole, which is much lower that for the more common technique used to grow diamond films, e.g. with hydrogen-methane plasmas for which methyl radicals are the principal growth species. The hydrogen-abstraction reactions require much higher energies (25 kcal/mole) than the $C_2$ dimer-based chemistry that is the heart of the UNCD technology. As is known, any inert gas, other than helium, may be used and carbon sources other than methane, such as acetylene, fullerene or anthracene may be used in some situations be preferred.

Figure 1:
FIG. 1 illustrates the enhancement of nucleation density for the growth of nanocrystalline films grown at 500° C., and seeded using nanocrystalline diamond powder for 5 minutes; 10 minutes, 15 minutes and 25 minutes.
Figure 1:
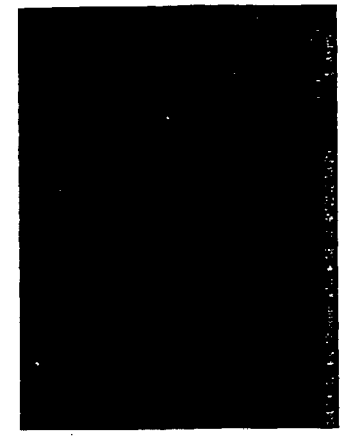
Figure 1:
Figure 1:
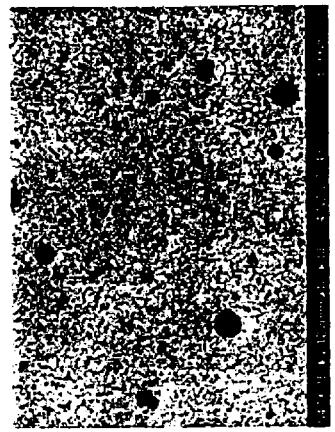

The subject invention involves the following key points:

1. The use of nanocrystalline diamond powder to seed the substrate surface prior to growth, in such a way as to maximize the areal density of initial growth sites on the surface. The best results are with nanocrystalline diamonds of less than about 20 nm average grain size but grain sizes up to about 30 nm may be used. As the number of initial growth initiation sites (referred to as nucleation sites) increases, the total time needed to deposit a film of a given thickness is reduced. It is critical that the seeding process be performed for longer times (up to 30 min.) in order to achieve sufficiently high nucleation densities. FIG. 1 illustrates the enhancement of nucleation density on the growth of a UNCD thin film at low temperatures.

2. The use of a water-cooled or equivalent sample holder/manipulator, which incorporates both active heating and cooling, in order to actively control the temperature of the substrates in the range of 200-500° C.

3. The use of a sample holder/manipulator that allows for continuous movement or rotation of the sample, in order to enhance the uniformity of the temperature of the sample during growth, which leads to films being deposited over large areas with uniform thickness.

A film grown at a nominal temperature of ~350° C. is shown in FIG. 10. This film was deposited on a silicon wafer that was seeded using nanocrystalline diamond powder ultrasonically for 30 minutes prior to growth, and was grown using an initial bias voltage of −100 V. The film was grown for four hours. After deposition, the wafer was cleaved and examined in cross-section using scanning electron microscopy (SEM). The film thickness measured is about 0.8 um. This is only slightly less than the ~1.0 μm thickness that is usually observed for UNCD films grown at 800° C. UV Raman data (not shown) indicate the clear presence of $sp^3$ bonding in the film.

While particular embodiments of the present invention have been shown and described, it will be appreciated by those skilled in the art that changes, modifications and improvements may be made, for example in the processing of the materials or in the electrode and/or cell design without departing from the true spirit and scope of the invention.

The invention claimed is:

1. A method of depositing nanocrystalline diamond film on a substrate at a rate of not less than about 0.2 microns/hour at a substrate temperature less than about 500° C., comprising seeding the substrate surface with nanocrystalline diamond powder to an areal density of not less than about $10^{10}$ sites/$cm^2$, and contacting the seeded substrate surface with a gas of about 99% by volume of an inert gas other than helium and about 1% by volume of methane or hydrogen and one or more of acetylene, fullerene and anthracene in the presence of a microwave induced plasma while maintaining the substrate temperature less than about 500° C. to deposit nanocrystalline diamond on the seeded substrate surface at a rate not less than about 0.2 microns/hour.

2. The method of claim 1, wherein the substrate is a semiconductor.

3. The method of claim 1, wherein the substrate is a complementary metal oxide semiconductor(CMOS).

4. The method of claim 1, wherein the substrate is maintained at a temperature less than about 400° C. during deposition of the nanocrystalline diamond.

5. The method of claim 1, wherein the gas contains methane.

6. The method of claim 1, wherein the gas contains acetylene.

7. The method of claim 1, wherein the gas contains a fullerene.

8. The method of claim 1, wherein the gas contains anthracene.

9. The method of claim 1, wherein the substrate is maintained at a temperature less than about 400°C. during deposition, the nanocrystalline diamond and the deposition rate is at least about 0.5 microns/hour.

10. The method of claim 9, wherein the substrate temperature is controlled in part by cooling the substrate during deposition.

11. The method of claim 1, wherein relative movement is provided between the substrate and the plasma during nanocrystalline diamond deposition.

12. The method of claim 1, wherein a majority of the substrate is maintained out of contact with the plasma during nanocrystalline deposition to control the substrate temperature.

13. The method of claim 1, wherein the gas is a mixture of argon and acetylene and hydrogen.

14. The method of claim 1, wherein the substrate is seeded by immersing the substrate in a mixture of an organic solvent and nanometer sized diamond powder.

15. The method of claim 14, wherein the mixture of solvent and powder is subjected to ultrasonic energy while the substrate is immersed therein for a time sufficient to provide $10^{10}$ to $10^{12}$ nucleation sites/$cm^2$ on the substrate.

16. The method of claim 15, wherein the powder has an average particle size of less than about 30 nanometers and the nanocrystalline film has an average particle size of less than about 20 nanometers.

* * * * *